US011874658B2

(12) United States Patent
Johmori

(10) Patent No.: US 11,874,658 B2
(45) Date of Patent: Jan. 16, 2024

(54) AIRBORNE ELECTROMAGNETIC SURVEY APPARATUS AND AIRBORNE ELECTROMAGNETIC SURVEY METHOD

(71) Applicant: NeoScience Co., Ltd., Sennan (JP)

(72) Inventor: Akira Johmori, Sennan (JP)

(73) Assignee: NeoScience Co., Ltd., Sennan (JP)

( * ) Notice: Subject to any disclaimer, the term of this patent is extended or adjusted under 35 U.S.C. 154(b) by 717 days.

(21) Appl. No.: 16/688,617

(22) Filed: Nov. 19, 2019

(65) Prior Publication Data

US 2020/0159211 A1 May 21, 2020

(30) Foreign Application Priority Data

Nov. 20, 2018 (JP) .................................. 2018-217249

(51) Int. Cl.
| | | |
|---|---|---|
| G05D 1/00 | (2006.01) | |
| G01R 33/09 | (2006.01) | |
| B64C 39/02 | (2023.01) | |
| G01V 3/17 | (2006.01) | |
| G01R 33/00 | (2006.01) | |
| G01V 3/40 | (2006.01) | |

(52) U.S. Cl.
CPC ......... *G05D 1/0027* (2013.01); *B64C 39/024* (2013.01); *G01R 33/0094* (2013.01); *G01V 3/17* (2013.01); *G01V 3/40* (2013.01); *B64U 2201/102* (2023.01)

(58) Field of Classification Search
CPC ... G01V 3/165; G05D 1/0027; G01R 33/0094
See application file for complete search history.

(56) References Cited

U.S. PATENT DOCUMENTS

| | | | |
|---|---|---|---|
| 4,492,924 A | 1/1985 | Nilsson | |
| 8,072,220 B2 * | 12/2011 | Dolgin ................. | G01C 21/165 |
| | | | 324/228 |
| 2020/0241163 A1 * | 7/2020 | Morrison ................. | G01V 3/16 |
| 2021/0033745 A1 * | 2/2021 | Døssing Andreasen . | B64D 3/02 |

FOREIGN PATENT DOCUMENTS

| | | |
|---|---|---|
| JP | S56-501661 A | 11/1981 |
| JP | 2004-286461 A | 10/2004 |
| JP | 2018-115901 A | 7/2018 |

OTHER PUBLICATIONS

Notice of Reasons for Refusal dated Sep. 6, 2022 in corresponding Japanese Patent Application No. 2018-217249 (with English translation)(7 pages).
Frischknecht, F.C., et al., "Electromagnetic Methods in Applied Geophysics", vol. 2, Application, Part B, Society of Exploration Geophysicists, 1987, pp. 105-270, Chapter 3.

* cited by examiner

*Primary Examiner* — Reena Aurora
(74) *Attorney, Agent, or Firm* — Oblon, McClelland, Maier & Neustadt, L.L.P.

(57) ABSTRACT

A transmitter loop is carried by a first aircraft. A receiver sensor is carried by a second aircraft. The first aircraft and the second aircraft fly away from each other. The transmitter loop transmits a primary magnetic field. The transmitted primary magnetic field induces a current in the earth. The induced current generates a secondary magnetic field in the air. The receiver sensor receives the generated secondary magnetic field, and detects strength of the received secondary magnetic field.

6 Claims, 4 Drawing Sheets

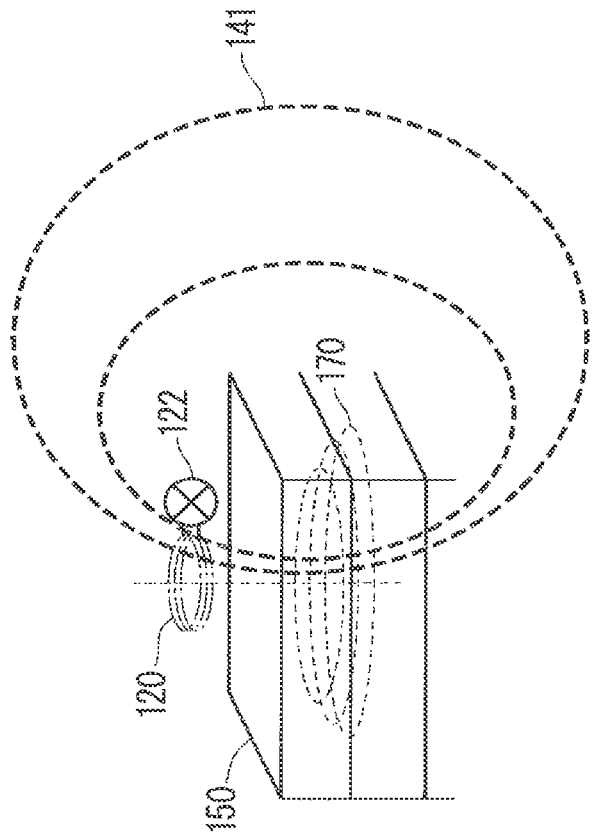
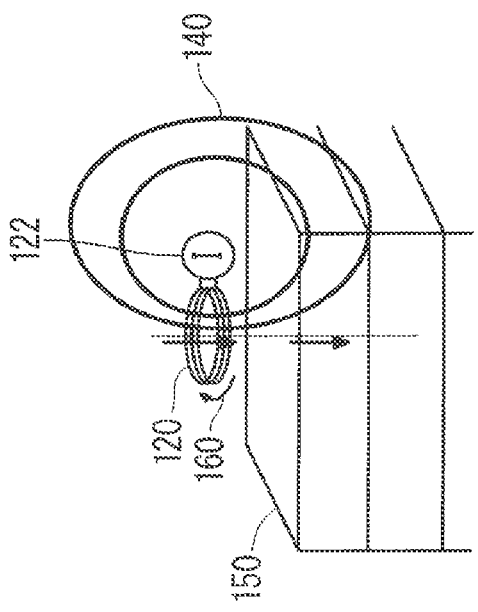
FIG. 2B
FIG. 2A

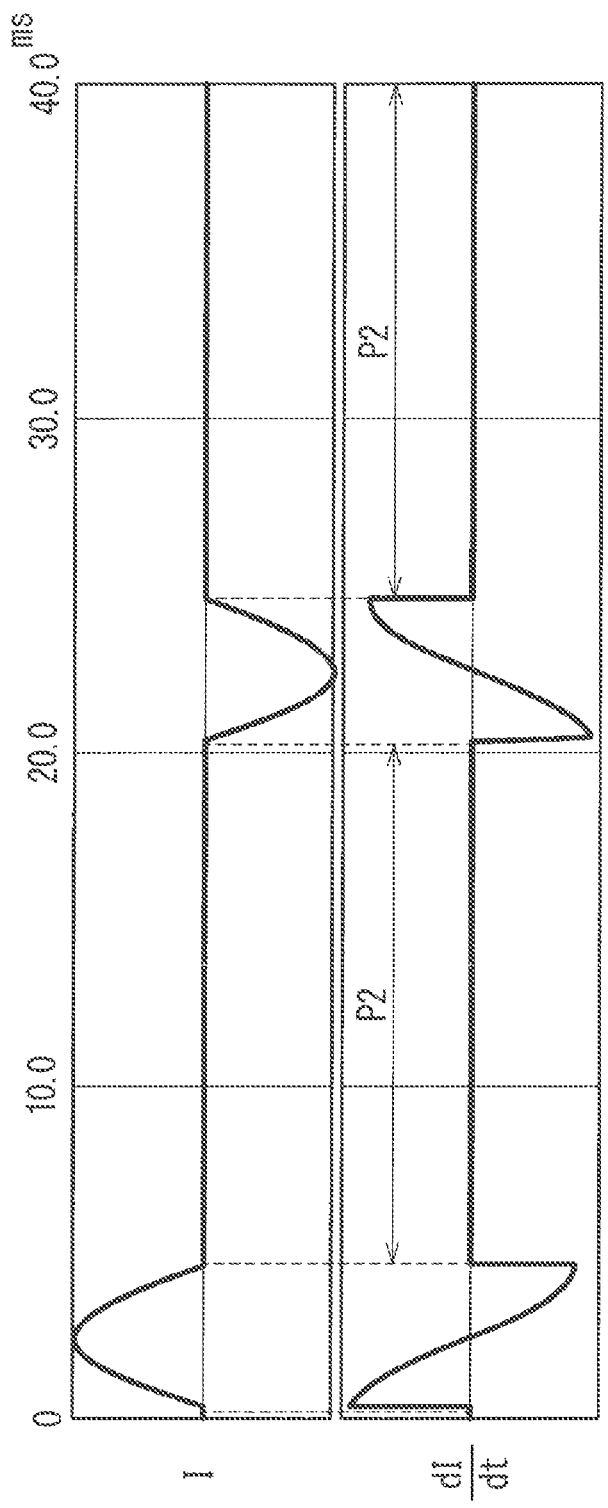

AIRBORNE ELECTROMAGNETIC SURVEY APPARATUS AND AIRBORNE ELECTROMAGNETIC SURVEY METHOD

BACKGROUND OF THE INVENTION

Field of the Invention

The present invention relates to airborne electromagnetic survey apparatuses and airborne electromagnetic survey methods.

Description of the Background Art

In an airborne electromagnetic survey, a transmitter loop and a receiver sensor are mounted on a helicopter in many cases. The transmitter loop transmits a primary magnetic field. The transmitted primary magnetic field induces a current in the earth. The induced current generates a secondary magnetic field in the air. The receiver sensor receives the generated secondary magnetic field. The received secondary magnetic field reflects the resistivity structure of the earth. The resistivity structure of the earth can thus be measured by analyzing strength of the received secondary magnetic field. Technology disclosed in Japanese Patent Application Laid-Open No. 2018-115901 is one example thereof.

In the technology disclosed in Japanese Patent Application Laid-Open No. 2018-115901, a loop antenna and a magnetic sensor are hung from a helicopter (Paragraphs 0017-0019). The loop antenna generates the primary magnetic field (Paragraph 0020). The generated primary magnetic field induces an eddy current underground (Paragraph 0020). The induced eddy current generates the secondary magnetic field (Paragraph 0020). The magnetic sensor detects a magnetic field including the generated secondary magnetic field (Paragraph 0020). The resistivity structure under the ground can be acquired from the detected magnetic field (Paragraph 0021).

In a conventional airborne electromagnetic survey, both the transmitter loop and the receiver sensor are mounted on a single crewed helicopter. The receiver sensor thus cannot widely be separated from the transmitter loop. Strength of the primary magnetic field received by the receiver sensor increases with decreasing distance of the receiver sensor from the transmitter loop. The secondary magnetic field received by the receiver sensor is extremely weak. In a case where the receiver sensor cannot widely be separated from the transmitter loop, the receiver sensor has to simultaneously receive the strong primary magnetic field and the extremely weak secondary magnetic field, so that the resistivity structure of the earth cannot accurately be measured. A survey depth to which the resistivity structure of the earth can be measured decreases with decreasing distance of the receiver sensor from the transmitter loop. Thus, in a case where the receiver sensor cannot widely be separated from the transmitter loop, the survey depth cannot be increased.

In the conventional airborne electromagnetic survey, both the transmitter loop and the receiver sensor are mounted on the single crewed helicopter. In a case of a small helicopter, the weight of a transmitter supplying a transmitter current to the transmitter loop is restricted as with the weight of the receiver sensor and accompanying objects, so that a transmitter having a strong power cannot be mounted, the transmitter current supplied to the transmitter loop cannot be increased, and the resistivity structure of the earth cannot accurately be measured.

These problems become noticeable, in particular, in a case where an aircraft on which the transmitter loop and the receiver sensor are mounted is a small aircraft, such as a drone.

SUMMARY

It is an object of the present invention to provide an airborne electromagnetic survey apparatus and an airborne electromagnetic survey method enabling accurate measurement of the resistivity structure of the earth and an increase in survey depth.

The present invention relates to an airborne electromagnetic survey apparatus and an airborne electromagnetic survey method.

A transmitter loop is carried by a first aircraft. A receiver sensor is carried by a second aircraft. The first aircraft and the second aircraft fly away from each other. The transmitter loop transmits a primary magnetic field. The transmitted primary magnetic field induces a current in the earth. The induced current generates a secondary magnetic field in the air. The receiver sensor receives the generated secondary magnetic field, and detects strength of the received secondary magnetic field.

The distance of the receiver sensor from the transmitter loop can freely be changed by changing a position of a second drone carrying the receiver sensor relative to a first drone carrying the transmitter loop. The receiver sensor can thus widely be separated from the transmitter loop. A ratio of strength of the secondary magnetic field to strength of the primary magnetic field at a position of installation of the receiver sensor can thereby be increased, so that the strength of the secondary magnetic field can accurately be measured. This enables accurate measurement of the resistivity structure of the earth and an increase in survey depth.

Furthermore, the first aircraft carrying the transmitter loop is not required to carry the receiver sensor and accompanying objects. The weight of the transmitter supplying the transmitter current to the transmitter loop can thus be increased to increase the transmitter current. This can increase the strength of the primary magnetic field, increase the induced current, and increase the strength of the secondary magnetic field, so that the strength of the secondary magnetic field can accurately be measured. The resistivity structure of the earth can thus accurately be measured.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are explanatory views for explaining the principle of measurement of the resistivity structure of the earth using the airborne electromagnetic survey apparatus in the first embodiment;

FIG. 4 is a graph showing a waveform and a time derivative waveform of a transmitter current in the airborne electromagnetic survey apparatus in the first embodiment.

DESCRIPTION OF THE PREFERRED EMBODIMENTS

1 Overview of Airborne Electromagnetic Survey

Figure 1:
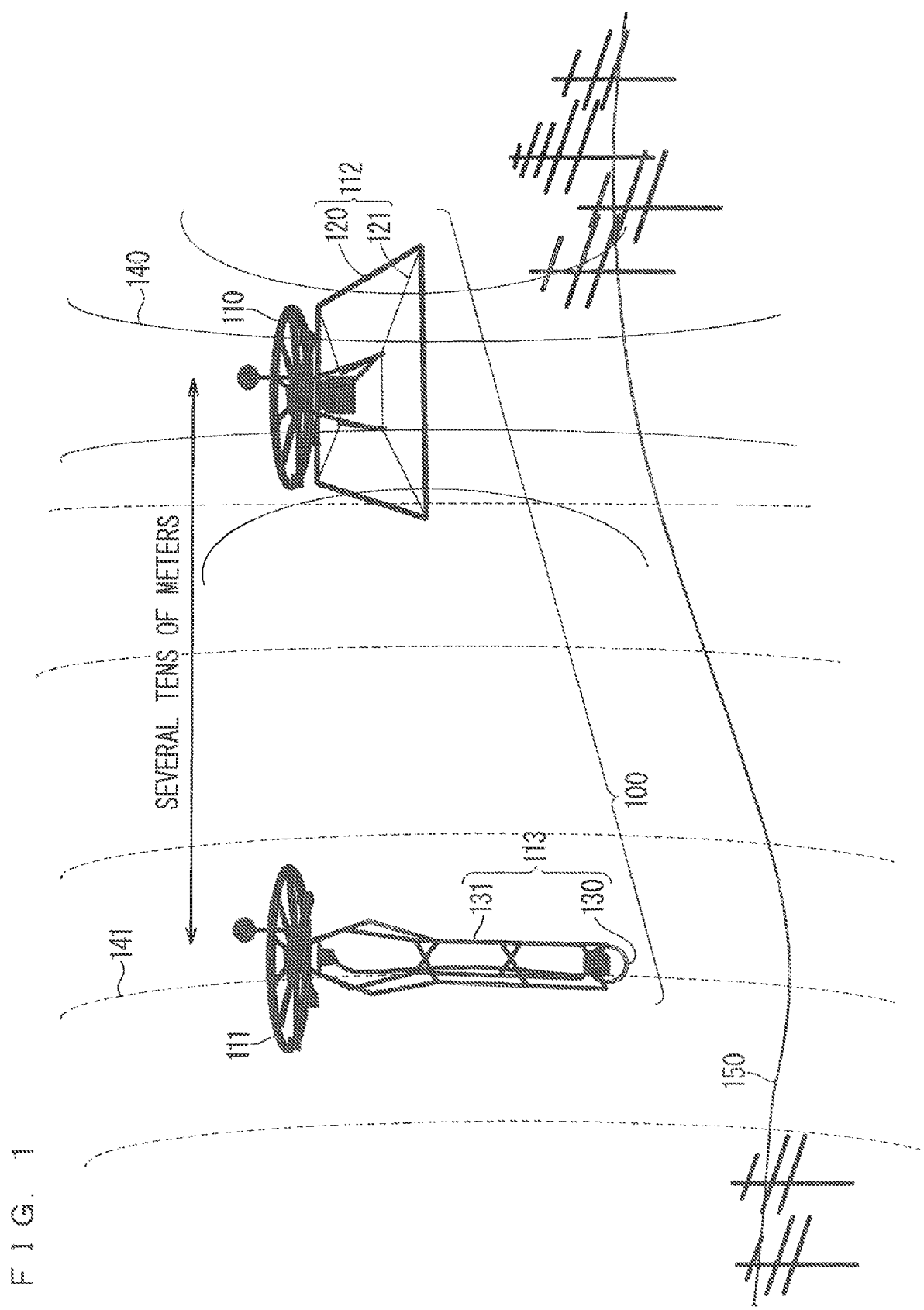
FIG. 1 is a schematic view schematically illustrating a state of an airborne electromagnetic survey apparatus in a first embodiment conducting an airborne electromagnetic survey.

FIG. 1 is a schematic view schematically illustrating a state of an airborne electromagnetic survey apparatus in a first embodiment conducting an airborne electromagnetic survey.

An airborne electromagnetic survey apparatus 100 in the first embodiment illustrated in FIG. 1 includes a first drone 110, a second drone 111, a first mounted device 112, and a second mounted device 113. The airborne electromagnetic survey apparatus 100 may include components other than these components.

The first drone 110 and the second drone 111 fly in the air away from each other.

The first mounted device 112 and the second mounted device 113 are mounted on the first drone 110 and the second drone 111, are carried by the first drone 110 and the second drone 111, and move with the first drone 110 and the second drone 111, respectively.

The first mounted device 112 includes a transmitter loop 120 and a first hanging tool 121. The second mounted device 113 includes a receiver sensor 130 and a second hanging tool 131. The transmitter loop 120 is hung from the first drone 110 by the first hanging tool 121. The receiver sensor 130 is hung from the second drone 111 by the second hanging tool 131. The transmitter loop 120 transmits a primary magnetic field 140. The receiver sensor 130 receives a secondary magnetic field 141, and detects strength H2 of the received secondary magnetic field 141. The detected strength H2 of the secondary magnetic field 141 is used to measure the resistivity structure of the earth 150.

The first drone 110 and the second drone 111 are uncrewed aircraft, and are rotary wing aircraft. The first drone 110 and the second drone 111 may be replaced with crewed aircraft, and with fixed-wing aircraft. However, advantages of the airborne electromagnetic survey apparatus 100 described below become noticeable, in particular, in a case where aircraft carrying the first mounted device 112 and the second mounted device 113 are small drones.

2 Principle of Measurement of Resistivity Structure of Earth Using Airborne Electromagnetic Survey Apparatus FIGS. 2A and 2B are explanatory views for explaining the principle of measurement of the resistivity structure of the earth using the airborne electromagnetic survey apparatus in the first embodiment.

In measurement of the resistivity structure of the earth 150 using the airborne electromagnetic survey apparatus 100, a transmitter current 160 is supplied to the transmitter loop 120 as illustrated in FIG. 2A. The transmitter loop 120 thereby transmits the primary magnetic field 140 in accordance with the supplied transmitter current 160. The supplied transmitter current 160 is a time-varying current. The primary magnetic field 140 is thus a time-varying magnetic field forming a time-varying electromagnetic wave, and, as illustrated in FIG. 2B, induces a current 170 in the earth 150 through electromagnetic induction upon being applied to the earth 150. The induced current 170 generates the secondary magnetic field 141 in the air. The generated secondary magnetic field 141 reflects the resistivity structure of the earth 150. The resistivity structure of the earth 150 can thus be measured by analyzing the strength H2 of the secondary magnetic field 141. Accuracy of measurement of the resistivity structure of the earth 150 is dependent on accuracy of measurement of the strength H2 of the secondary magnetic field 141. A survey depth to which the resistivity structure of the earth 150 can be measured is dependent on the distance of the receiver sensor 130 from the transmitter loop 120.

3 Advantages of Airborne Electromagnetic Survey Apparatus

According to measurement of the resistivity structure of the earth 150 using the airborne electromagnetic survey apparatus 100, the distance of the receiver sensor 130 from the transmitter loop 120 can freely be changed by changing a position of the second drone 111 relative to the first drone 110. The receiver sensor 130 can thus widely be separated from the transmitter loop 120. For example, the receiver sensor 130 can be separated from the transmitter loop 120 by several tens of meters as illustrated in FIG. 1. A ratio H2/H1 of the strength H2 of the secondary magnetic field 141 to strength H1 of the primary magnetic field 140 at a position of installation of the receiver sensor 130 can thereby be increased, so that the strength H2 of the secondary magnetic field 141 can accurately be measured. This enables accurate measurement of the resistivity structure of the earth 150 and an increase in survey depth.

Furthermore, according to measurement of the resistivity structure of the earth 150 using the airborne electromagnetic survey apparatus 100, the first drone 110 carrying the transmitter loop 120 is not required to carry the receiver sensor 130 and accompanying objects. Even in a case where the weight of objects that can be mounted on the first drone 110 is low, the weight of a transmitter 122 supplying the transmitter current 160 to the transmitter loop 120 can be increased to increase the transmitter current 160. This can increase the strength H1 of the primary magnetic field 140, increase the induced current 170, and increase the strength H2 of the secondary magnetic field 141, so that the strength H2 of the secondary magnetic field 141 can accurately be measured. The resistivity structure of the earth 150 can thus accurately be measured.

4 Frequency-Domain Electromagnetic Survey Method and Time-Domain Electromagnetic Survey Method The resistivity structure of the earth 150 may be measured by either a frequency-domain electromagnetic survey method (DIGHEM) or a time-domain electromagnetic survey method (P-THEM), but is preferably measured by P-THEM. In a case where the resistivity structure of the earth 150 is measured by P-THEM, the primary magnetic field 140 having a pulse or square waveform is transmitted, and the strength H2 of the secondary magnetic field 141 is measured during a time period during which the strength H1 of the primary magnetic field 140 is 0 or is close to 0. The strength H2 of the secondary magnetic field 141 can thereby accurately be measured even in a case where the receiver sensor 130 cannot sufficiently be separated from the transmitter loop 120. The resistivity structure of the earth 150 can thus accurately be measured.

5 Flight Control

Figure 3:
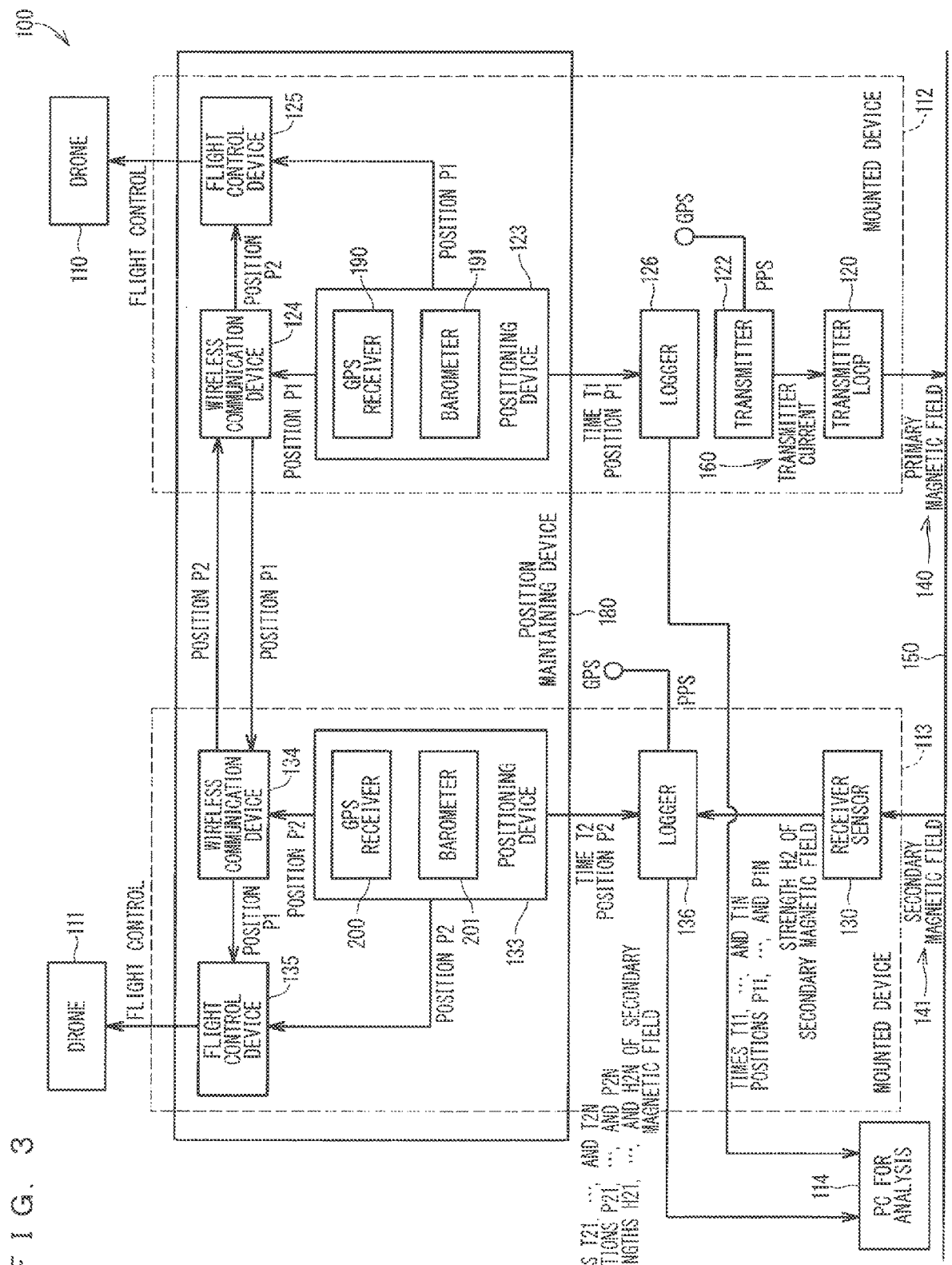
FIG. 3 is a block diagram of the airborne electromagnetic survey apparatus in the first embodiment.

FIG. 3 is a block diagram of the airborne electromagnetic survey apparatus in the first embodiment.

The airborne electromagnetic survey apparatus 100 includes a position maintaining device 180 as shown in FIG. 3.

The position maintaining device 180 maintains the position of the second drone 111 relative to the first drone 110 in a set position. A state of the receiver sensor 130 being far away from the transmitter loop 120 is thereby maintained.

The position maintaining device 180 includes a first positioning device 123, a first wireless communication device 124, and a first flight control device 125 included in the first mounted device 112. The position maintaining device 180 also includes a second positioning device 133, a second wireless communication device 134, and a second flight control device 135 included in the second mounted device 113.

The first positioning device 123 measures a time T1 and a position P1 of the first drone 110 at the time T1, and outputs the time T1 and the position P1 as measured. The second positioning device 133 measures a time T2 and a position P2 of the second drone 111 at the time T2, and outputs the time T2 and the position P2 as measured.

The first wireless communication device 124 and the second wireless communication device 134 wirelessly communicate with each other.

The first flight control device 125 acquires the output position P1 of the first drone 110, and acquires the output position P2 of the second drone 111 through wireless communication. The first flight control device 125 also performs flight control on the first drone 110 based on the acquired positions P1 and P2. The second flight control device 135 acquires the output position P1 of the first drone 110 through wireless communication, and acquires the output position P2 of the second drone 111. The second flight control device 135 also performs flight control on the second drone 111 based on the acquired positions P1 and P2. Flight control performed on the first drone 110 and flight control performed on the second drone 111 enable the first drone 110 and the second drone 111 to perform link flight of maintaining the position of the second drone 111 relative to the first drone 110 in the set position.

The first flight control device 125 may be omitted so that the position of the second drone 111 relative to the first drone 110 is maintained in the set position only through flight control performed on the second drone 111. The second flight control device 135 may be omitted so that the position of the second drone 111 relative to the first drone 110 is maintained in the set position only through flight control performed on the first drone 110.

Part or all of functionality implemented in the first flight control device 125 and the second flight control device 135 may be implemented in a controller that is on the ground, and can wirelessly communicate with the first drone 110 and the second drone 111.

The first positioning device 123 includes a first global positioning system (GPS) receiver 190 and a first barometer 191. The first GPS receiver 190 receives a positioning signal arriving from a GPS satellite, and calculates the time T1 and the position P1 of the first drone 110 at the time T1 based on the received positioning signal. The first barometer 191 measures atmospheric pressure. The first positioning device 123 corrects the calculated position P1 as necessary using the measured atmospheric pressure, and outputs the corrected position P1. The first barometer 191 may be omitted. The second positioning device 133 includes a second GPS receiver 200 and a second barometer 201. The second GPS receiver 200 receives a positioning signal arriving from the GPS satellite, and calculates the time T2 and the position P2 of the second drone 111 at the time T2 based on the received positioning signal. The second barometer 201 measures atmospheric pressure. The second positioning device 133 corrects the calculated position P2 as necessary using the measured atmospheric pressure, and outputs the corrected position P2. The second barometer 201 may be omitted. The first GPS receiver 190 and the second GPS receiver 200, which are satellite positioning system receivers receiving the positioning signals arriving from the GPS satellite, may be replaced with satellite positioning system receivers receiving positioning signals arriving from other types of positioning satellites.

6 Transmission of Primary Magnetic Field

The airborne electromagnetic survey apparatus 100 includes the transmitter 122 and the transmitter loop 120 included in the first mounted device 112 as shown in FIG. 3.

The transmitter 122 incorporates a battery and a capacitor. In the transmitter 122, electrical energy supplied from the battery is stored in the capacitor. After the electrical energy is stored in the capacitor, opposite electrodes of the capacitor are shorted by the transmitter loop 120. The electrical energy stored in the capacitor is thereby supplied to the transmitter loop 120. In this case, the transmitter current 160 is supplied from the transmitter 122 to the transmitter loop 120.

The transmitter loop 120 transmits the primary magnetic field 140 in accordance with the supplied transmitter current 160.

FIG. 4 is a graph showing a waveform and a time derivative waveform of the transmitter current in the airborne electromagnetic survey apparatus in the first embodiment.

The capacitor and the transmitter loop 120 constitute an LC resonance circuit by capacitance of the capacitor and inductance of the transmitter loop 120. A current flowing through the transmitter loop 120 in one direction is interrupted by a diode, a thyristor, and the like. The transmitter current 160 thus has a half-sine waveform shown in FIG. 4.

7 Reception of Secondary Magnetic Field

The airborne electromagnetic survey apparatus 100 includes the receiver sensor 130 included in the second mounted device 113 as shown in FIG. 3.

The receiver sensor 130 receives the secondary magnetic field 141, and detects the strength H2 of the received secondary magnetic field 141. Transmission and reception are synchronized using a pulse per second (PPS) signal of the GPS.

The time period during which the strength H2 of the secondary magnetic field 141 used to measure the resistivity structure of the earth 150 is measured is a time period P2 during which the strength H1 of the primary magnetic field 140 is 0 or is close to 0 shown in FIG. 4.

8 Recording

The airborne electromagnetic survey apparatus 100 includes a first logger 126 included in the first mounted device 112 as shown in FIG. 3. The airborne electromagnetic survey apparatus 100 also includes a second logger 136 included in the second mounted device 113.

The first logger 126 records the time T1 and the position P1 of the first drone 110 at the time T1 at intervals over time. The first logger 126 thereby records a plurality of times T11, . . . , and T1N and a plurality of positions P11, . . . , and P1N of the first drone 110 at the times T11, . . . , and T1N.

The second logger 136 records the time T2 and the position P2 of the second drone 111 at the time T2 at intervals over time. The second logger 136 thereby records a plurality of times T21, . . . , and T2N and a plurality of positions P21, . . . , and P2N of the second drone 111 at the times T21, . . . , and T2N. The second logger 136 also records the strength H2 of the secondary magnetic field 141 at the time T2 at intervals over time. The second logger 136 thereby records a plurality of strengths H21, . . . , and H2N of the secondary magnetic field 141 at the times T21, . . . , and T2N.

9 Analysis of Strength of Secondary Magnetic Field

The airborne electromagnetic survey apparatus 100 includes a personal computer (PC) for analysis 114 as shown in FIG. 3.

After the end of flight of the first drone 110, the PC for analysis 114 captures the times T11, . . . , and T1N and the positions P11, ..., and P1N of the first drone 110 from the first logger 126. Furthermore, after the end of flight of the second drone 111, the PC for analysis 114 captures the times T21, ..., and T2N, the positions P21, ..., and P2N of the second drone 111, and the strengths H21, ..., and H2N of the secondary magnetic field 141 from the second logger 136. The PC for analysis 114 analyzes the times T11, ..., and T1N, the positions P11, ..., and P1N, the times T21, ..., and T2N, the positions P21, ..., and P2N, and the strengths H21, ..., and H2N as captured to calculate the resistivity structure of the earth 150. The resistivity structure of the earth 150 is calculated in consideration of the position of the second drone 111 relative to the first drone 110 at timings at which the strengths H21, ..., and H2N are measured specified from the times T11, ..., and T1N, the positions P11, ..., and P1N, the times T21, ..., and T2N, and the positions P21, ..., and P2N.

10 Airborne Electromagnetic Survey Method

In an airborne electromagnetic survey using the airborne electromagnetic survey apparatus 100, the first drone 110 on which the first mounted device 112 is mounted is flown. Furthermore, the second drone 111 on which the second mounted device 113 is mounted is flown away from the first drone 110. The first drone 110 and the second drone 111 are flown above a position at which the resistivity structure of the earth 150 is measured. In this case, the first drone 110 and the second drone 111 are flown so that the position of the second drone 111 relative to the first drone 110 is maintained in the set position through flight control performed by the position maintaining device 180.

In a state of the position of the second drone 111 relative to the first drone 110 being maintained in the set position, the transmitter loop 120 is caused to transmit the primary magnetic field 140. Furthermore, the receiver sensor 130 is caused to receive the secondary magnetic field 141.

The first drone 110 is then caused to end flight, and return to the ground. The second drone 111 is also caused to end flight, and return to the ground.

The PC for analysis 114 is then caused to capture data from the first logger 126 and the second logger 136. In capture of the data, the times T11, ..., and T1N and the positions P11, ..., and P1N of the first drone 110 are captured from the first logger 126. The times T121, ..., and T2N, the positions P21, ..., and P2N of the second drone 111, and the strengths H21, ..., and 112N of the secondary magnetic field 141 are captured from the second logger 136. The PC for analysis 114 analyzes the times T11, ..., and T1N, the positions P11, ..., and P1N, the times T21, ..., and T2N, the positions P21, ..., and P2N, and the strengths H21, ..., and 112N as captured to calculate the resistivity structure of the earth 150.

While the invention has been shown and described in detail, the foregoing description is in all aspects illustrative and not restrictive. It is therefore understood that numerous modifications and variations can be devised without departing from the scope of the invention.

What is claimed is:

1. An airborne electromagnetic survey apparatus comprising:
   a first aircraft;
   a second aircraft capable of flying away from the first aircraft;
   a transmitter loop carried by the first aircraft, and transmitting a primary magnetic field;
   a receiver sensor carried by the second aircraft, and receiving a secondary magnetic field generated in air by a current induced in earth by the primary magnetic field and detecting strength of the secondary magnetic field; and
   a position maintaining device maintaining a position of the second aircraft relative to a position of the first aircraft,
   wherein the position maintaining device includes first flight control circuitry of the first aircraft and second flight control circuitry of the second aircraft in communication with one another.

2. The airborne electromagnetic survey apparatus according to claim 1, wherein
   the position maintaining device includes:
   a first positioning device carried by the first aircraft, and measuring a position of the first aircraft;
   a second positioning device carried by the second aircraft, and measuring a position of the second aircraft; and
   a flight control device carried by at least one of the first aircraft and the second aircraft, and performing, on at least one of the first aircraft and the second aircraft, flight control of maintaining the position of the second aircraft relative to the position of the first aircraft based on the position of the first aircraft and the position of the second aircraft.

3. The airborne electromagnetic survey apparatus according to claim 2, wherein
   the first positioning device includes a first satellite positioning system receiver; and
   the second positioning device includes a second satellite positioning system receiver.

4. The airborne electromagnetic survey apparatus according to claim 1, wherein
   the first aircraft is a first drone, and
   the second aircraft is a second drone.

5. The airborne electromagnetic survey apparatus according to claim 1,
   wherein the position maintaining device includes first flight control circuitry of the first aircraft and second flight control circuitry of the second aircraft in communication with one another.

6. An airborne electromagnetic survey method comprising:
   a) flying a first aircraft carrying a transmitter loop;
   b) flying a second aircraft carrying a receiver sensor away from the first aircraft and maintaining a position of the second aircraft relative to a position of the first aircraft with a position maintaining device;
   c) causing the transmitter loop to transmit a primary magnetic field; and
   d) causing the receiver sensor to receive a secondary magnetic field generated by a current induced underground by the primary magnetic field,
   wherein the position maintaining device includes first flight control circuitry of the first aircraft and second flight control circuitry of the second aircraft in communication with one another.

* * * * *